(12) United States Patent
Iwata (10) Patent No.: US 7,872,316 B2
(45) Date of Patent: Jan. 18, 2011

(54) SEMICONDUCTOR DEVICE AND METHOD OF MANUFACTURING SEMICONDUCTOR DEVICE

(75) Inventor: Toshihiko Iwata, Nagasaki (JP)

(73) Assignee: Sony Corporation, Tokyo (JP)

( * ) Notice: Subject to any disclaimer, the term of this patent is extended or adjusted under 35 U.S.C. 154(b) by 52 days.

(21) Appl. No.: 12/119,864

(22) Filed: May 13, 2008

(65) Prior Publication Data

US 2008/0283974 A1 Nov. 20, 2008

(30) Foreign Application Priority Data

May 17, 2007 (JP) ............................... 2007-131452

(51) Int. Cl.
*H01L 29/49* (2006.01)
*H01L 29/51* (2006.01)
(52) U.S. Cl. ............... 257/401; 257/288; 257/394; 257/406; 257/652; 257/E29.161; 257/E29.162; 257/E29.165
(58) Field of Classification Search ............ 257/288, 257/394, 401, 406, 652, E29.161, E29.162, 257/E29.165
See application file for complete search history.

(56) References Cited

U.S. PATENT DOCUMENTS 7,183,613 B1 * 2/2007 Zhu et al. .................... 257/351
7,579,227 B2 * 8/2009 Hirase et al. ................ 438/197
2005/0272235 A1 * 12/2005 Wu et al. .................... 438/592
2006/0166424 A1 * 7/2006 Schaeffer et al. ............ 438/199
2006/0237803 A1 * 10/2006 Zhu et al. .................... 257/410

FOREIGN PATENT DOCUMENTS

| JP | 61-006867 | 1/1986 |
| JP | 11-284179 | 10/1999 |
| JP | 2003-258241 | 9/2003 |
| JP | 2005-012075 | 1/2005 |
| JP | 2007-059881 | 8/2007 |

OTHER PUBLICATIONS

Motofumi Saitoh et al.; Strain Controlled CMOSFET with Phase Controlled Full-silicide (PC-FUSI)/HfSiON Gate Stack Structure for 45nm-NODE LSTP Devices; 2006 Symposium on VLSI Technology Digest of Technical Papers.
Office Action issued by the Japanese Patent Office on May 26, 2009 in connection to related Japanese Patent Application No. 2007-131452.

* cited by examiner

*Primary Examiner*—Victor A Mandala
(74) *Attorney, Agent, or Firm*—SNR Denton US LLP (57) ABSTRACT

Disclosed herein is a semiconductor device including a gate insulating film formed over a semiconductor substrate, and a gate electrode formed over the gate insulating film, wherein the gate insulating film is so provided as to protrude from both sides of the gate electrode, and the gate electrode includes a wholly silicided layer.

5 Claims, 8 Drawing Sheets

SEMICONDUCTOR DEVICE AND METHOD OF MANUFACTURING SEMICONDUCTOR DEVICE

CROSS REFERENCES TO RELATED APPLICATIONS

The present invention contains subject matter related to Japanese Patent Application JP 2007-131452 filed in the Japan Patent Office on May 17, 2007, the entire contents of which being incorporated herein by reference.

BACKGROUND OF THE INVENTION

1. Field of the Invention

The present invention relates to a semiconductor device and a method of manufacturing a semiconductor device, particularly a semiconductor device including a fully silicided gate electrode and a manufacturing method therefor.

2. Description of the Related Art

In relation to the transistor structures in recent years, a further reduction in the microscopic size of insulated gate type field effect transistors using a silicon oxide film (these field effect transistors will hereinafter be referred to as MOSFET) has been advanced. However, when thinning of a gate insulating film is advanced along with the proportional reduction of the MOSFET, an increase in the gate leak current due to the tunnel current becomes a problem. In order to obviate this problem, researches of MOSFETs having a gate insulating film formed by use of a high dielectric constant material (high dielectric constant gate insulating film) have been made.

On the other hand, polycrystalline silicon with an impurity added thereto is used as a material for gate electrodes of MOSFETs. Since the material is a semiconductor, however, the surface of the gate electrode would undergo a little depletion, causing a lowering in the current driving force of the transistor. As a countermeasure against this problem, a Fully Silicided gate (FUSI) technology in which the gate electrode is wholly silicided has come to be investigated.

Besides, in recent years, from the viewpoints of reducing the gate leak current and simultaneously suppressing the depletion of the gate electrode, researches have been made of application of a gate stack structure based on a combination of the high dielectric constant gate insulating film with the FUSI technology to MOSFETs (refer to Motofumi Saitoh et al., "Strain Controlled CMOSFET with Phase Controlled Full-silicide (PC-FUSI)/HfSiON Gate Stack Structure for 45 nm-node LSTP Devices", 2006 *Symposium on VLSI Technology Digest of Technical Papers*, 2006 IEEE, 2006).

Figure 8A:
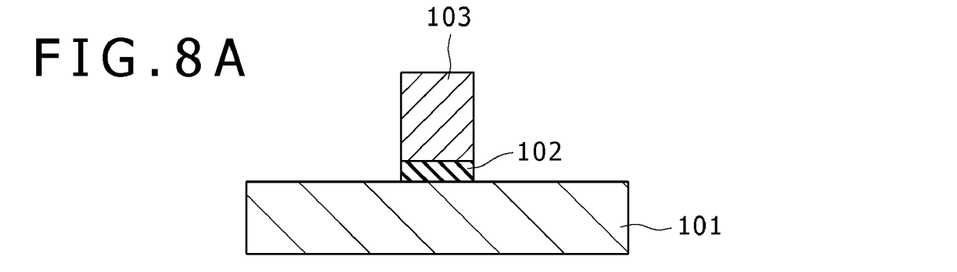
FIGS. 8A to 8D are sectional step diagrams for illustrating a manufacturing method according to the related art.
Figure 8B:
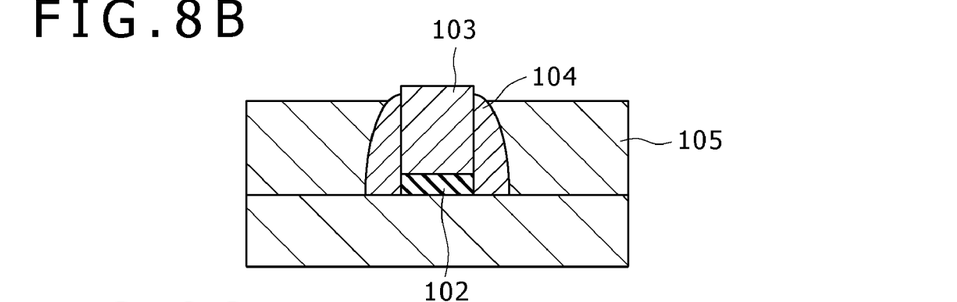
Figure 8C:
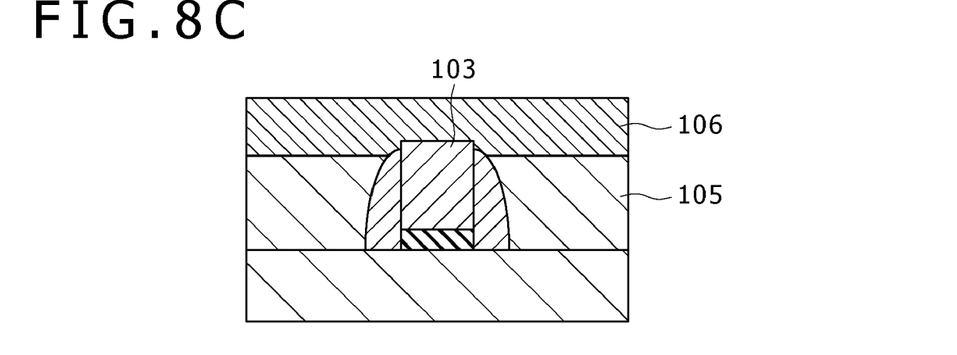
Figure 8D:
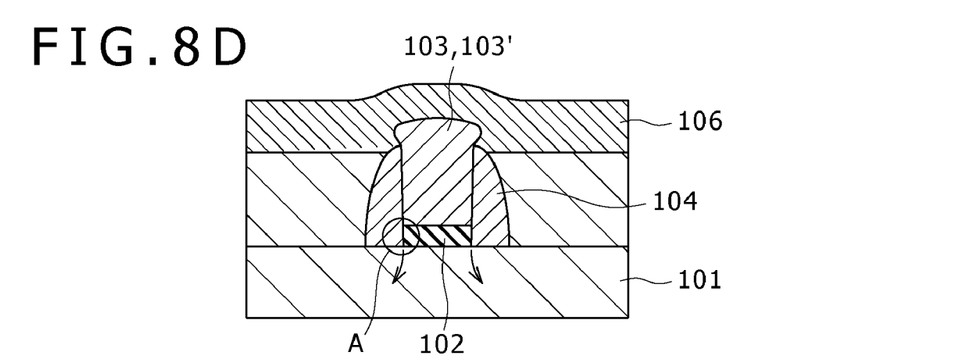

FIGS. 8A to 8D show an example of a method of manufacturing a semiconductor device having the above-mentioned gate stack structure. First, as shown in FIG. 8A, a polysilicon gate electrode 103 is formed in a pattern over a silicon substrate 101, with a high dielectric constant material gate insulating film 102 therebetween. Thereafter, as shown in FIG. 8B, insulating side walls 104 are formed at side walls of the gate insulating film 102 and the gate electrode 103. Next, an insulating film 105 is formed so as to bury the gate electrode 103 and the side walls 104, and the insulating film 105 is flattened by CMP (Chemical Mechanical Polishing), thereby exposing the gate electrode 103. Subsequently, as shown in FIG. 8C, a nickel film 106 is built up in the state of covering the insulating film 105 and the gate electrode 103. Thereafter, as shown in FIG. 8D, a heat treatment is conducted to bring the polysilicon constituting the gate electrode 103 and the nickel film 106 as an upper layer into reaction with each other, whereby the gate electrode 103 as a whole is fully silicided, to form a fully silicided gate electrode 103'.

SUMMARY OF THE INVENTION

However, in the case of forming the fully silicided gate according to the above-mentioned procedure, the following problem would be generated. At the time of siliciding the polysilicon gate electrode by conducting a heat treatment, the gate electrode 103 is expanded in volume, as shown in FIG. 8D. The volume expansion leads to the generation of a gap in region A between the gate insulating film 102 under the fully silicided gate electrode 103' and the side wall 104. Then, the metallic material (nickel) diffuses leakingly through the gap to the side of the silicon substrate 101, possibly causing such problems as variations in the threshold voltage of the MOSFET, leakage, etc.

Thus, there is a need for a semiconductor device such that a fully silicided gate electrode can be formed while preventing leakage of a metallic material to the substrate side and that the device characteristics can be maintained notwithstanding the presence of the fully silicided gate electrode, and for a method of manufacturing the semiconductor device.

In order to fulfill the above need, according to an embodiment of the present invention, there is provided a semiconductor device including a gate insulating film formed over a semiconductor substrate, and a gate electrode formed over the gate insulating film. In the semiconductor device, the gate insulating film is so provided as to protrude from both sides of the gate electrode, and the gate electrode includes a wholly silicided layer.

In the semiconductor device configured as above, the gate insulating film protruding from both sides of the gate electrode is provided between the gate electrode and the semiconductor substrate, so that there is no interface that provides rectilinear connection between the gate electrode and the semiconductor substrate. Therefore, the silicide material constituting the gate electrode, particularly, the metal is prevented from migrating by diffusion to the semiconductor substrate side.

Besides, according to another embodiment of the present invention, there is provided a method of manufacturing a semiconductor device configured as above. The manufacturing method includes the following steps, which are sequentially carried out. First, in a first step, a silicon film is formed over a semiconductor substrate, with a gate insulating film therebetween. Next, in a second step, the silicon film is patterned while leaving the gate insulating film over the semiconductor substrate, to form a gate electrode including the silicon film. Thereafter, in a third step, an insulating side wall is formed at a side wall of the gate electrode over the gate insulating film, and the gate insulating film is pattern etched by using the side wall and the gate electrode as a mask. Subsequently, in a fourth step, a metal film is formed in the state of covering an exposed part of the gate electrode, and the gate electrode is fully silicided by a heat treatment.

In another embodiment of the invention, the gate electrode is fully silicided in the condition where the gate insulating film is so provided as to protrude from both sides of the gate electrode to the positions under the side wall, i.e., in the condition where there is no interface that provides rectilinear connection between the gate electrode and the semiconductor substrate. Therefore, even in the case where the gate electrode is expanded at the time of being fully silicided and where a gap is generated due to delamination at an interface disposed in the range from the gate electrode to the semiconductor substrate, it is possible to prevent the silicide material constituting the gate electrode, particularly, the metal from migrating by diffusion to the semiconductor substrate side.

According to an embodiment of the present invention, the metallic material contained in the fully silicided gate electrode may be prevented from migrating by diffusion to the semiconductor substrate side, so that it is possible to obtain a semiconductor device in which variations in threshold voltage, leakage and the like troubles are prevented, notwithstanding the presence of the fully silicided gate electrode, and in which the device characteristics are maintained stably.

DETAILED DESCRIPTION OF THE PREFERRED EMBODIMENTS

Now, embodiments of the semiconductor device and the manufacturing method therefor according to the present invention will be described in detail below, based on the drawings. In the following description of the embodiments, the configuration will be described following the sequence of manufacturing steps.

First Embodiment

Figure 1A:
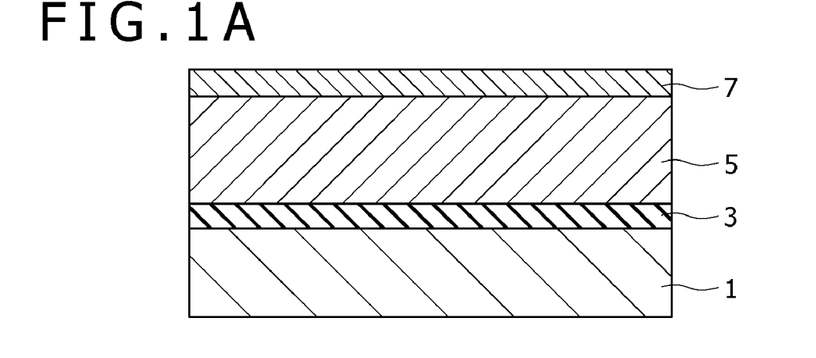
FIGS. 1A to 1D are sectional step diagrams (No. 1) illustrating a method of manufacturing a semiconductor device according to a first embodiment of the present invention.

First, as shown in FIG. 1A, device isolation regions (not shown) are formed on the face side of a semiconductor substrate 1 including a p-type single crystal silicon, and then a gate insulating film 3 including a high dielectric constant material is formed. As the high dielectric constant material, for example, a material which contains a metal oxide such as HfSiON and has a dielectric constant higher than that of silicon oxide is used, and a film thereof is formed in a thickness of about 5 nm. Incidentally, in the case of forming a p-type MOS transistor together with an n-type MOS transistor over the semiconductor substrate 1, an n-well diffusion layer is preliminarily formed in the region for forming the p-type MOS transistor, of the n-type semiconductor substrate 1.

Next, a polysilicon film 5 for forming a gate electrode is built up in a thickness of, for example, about 200-300 nm by CVD. Thereafter, as occasion demands, an impurity is introduced into the polysilicon film in the region for forming the n-type MOS transistor, or into the polysilicon film in the region for forming the p-type MOS transistor. Subsequently, a stopper layer 7 including a silicon nitride film is formed over the polysilicon film 5.

Figure 1B:
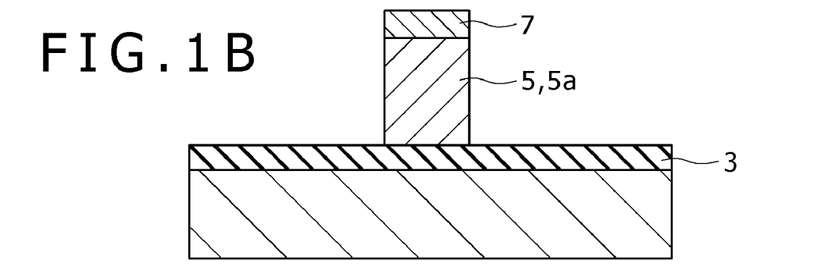

Next, as shown in FIG. 1B, the stopper layer 7 and the polysilicon film 5 are patterned by reactive ion etching (RIE) in which a resist pattern (not shown) is used as a mask. By this step, a polysilicon gate electrode 5a is formed over the gate insulating film 3. Here, it is particularly important to leave the gate insulating film 3 over the whole surface of the semiconductor substrate 1. It is to be noted, however, that part of the gate insulating film 3 which is by the side of the gate electrode 5 may be reduced in material thickness by the RIE, resulting in the formation of a step in the gate insulating film 3. Besides, after such etching, the resist pattern used as the mask in the RIE is removed.

Figure 1C:
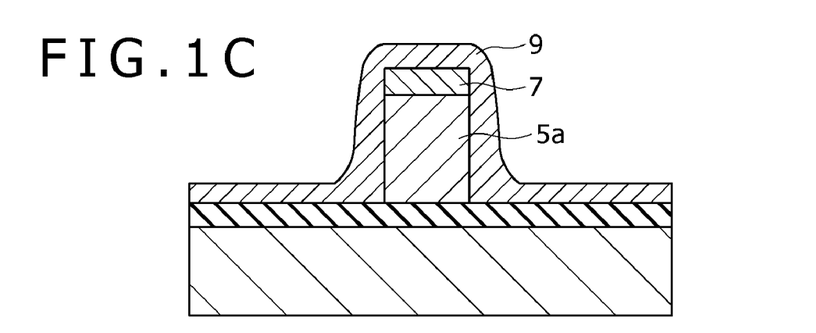

Subsequently, as shown in FIG. 1C, a silicon nitride ($Si_3N_4$) film 9 is built up by CVD in the state of covering the gate electrode 5a and in a thickness of about 20-100 nm, for example.

Figure 1D:
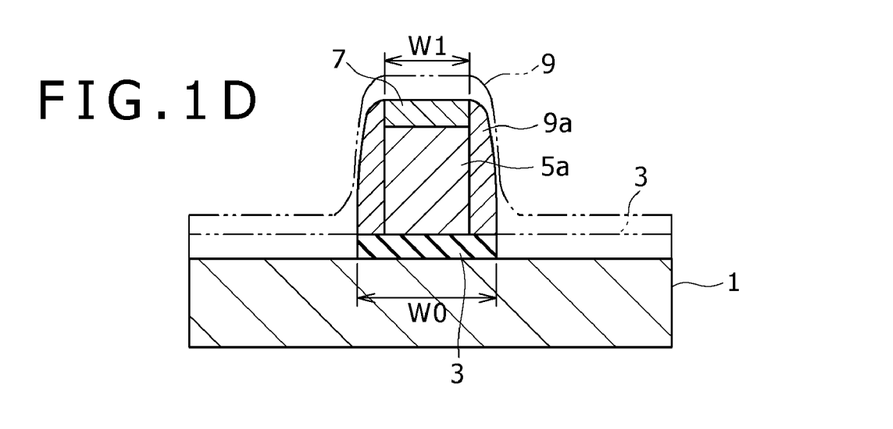

Thereafter, as shown in FIG. 1D, the silicon nitride film 9 is subjected to whole-area etch-back by RIE, whereby the silicon nitride film 9 is left on the side surfaces of the gate electrode 5a inclusive of the stopper layer 7, to form first side walls 9a. Subsequently, the gate insulating film 3 as the under layer is also etched back and patterned, to expose the semiconductor substrate 1. As a result, a gate electrode 5a having a width W1 smaller than the width W0 of the gate insulating film 3 is provided in the center of the patterned gate insulating film 3. In other words, the gate insulating film 3 under the gate electrode 5a is protruding into the areas under the first side walls 9a, and the interface between the gate electrode 5a and the first side walls 9a are blocked by the gate insulating film 3 and, hence, prevented from rectilinearly reaching the semiconductor substrate 1. Incidentally, the width W0 of the gate insulating film 3 is equal to the sum of the width W1 of the gate electrode 3 and the widths of the first side walls 9a on both sides of the gate electrode 3.

Figure 2A:
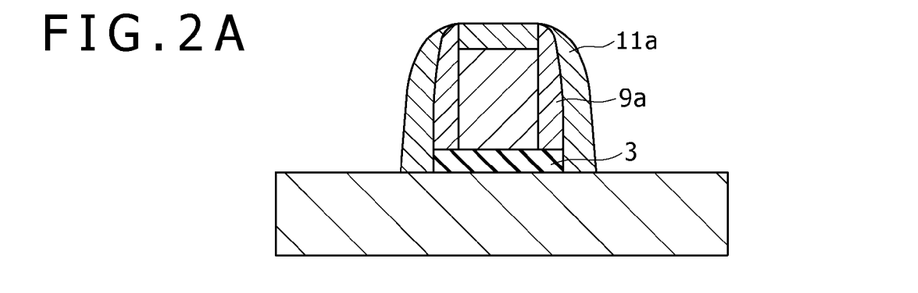
FIGS. 2A to 2D are sectional step diagrams (No. 2) illustrating the method of manufacturing a semiconductor device according to the first embodiment.

Next, as shown in FIG. 2A, second side walls 11a including silicon nitride are formed at both sides of the first side walls 9a and the gate insulating film 3. The second side walls 11a are formed in the same manner as the first side walls 9a. As a result, side walls of the gate insulating film 3 including the high dielectric constant material are covered with the second side walls 11a. Therefore, even when oxidation or a heat treatment in an oxidizing gas-containing atmosphere or building-up of an insulating film is conducted in the subsequent step(s), it is possible to prevent metal contamination of the semiconductor substrate 1 through the interface of the gate insulating film 3, or a lowering in the relative permittivity of the gate insulating film 3 due to formation of an extremely thin silicon oxide film into the interface of the semiconductor substrate 1.

Figure 2B:
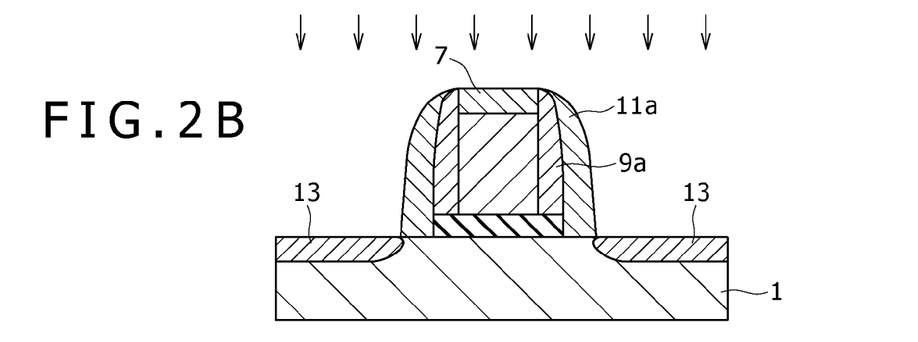

Subsequently, as shown in FIG. 2B, an impurity is introduced into an exposed surface layer of the semiconductor substrate 1 by ion implantation conducted by using the gate electrode 5a, the first side walls 9a and the second side walls 11a as a mask. Next, an activating heat treatment for the thus introduced impurity is conducted, to form a low dose diffusion layer (LDD) at a surface layer of the semiconductor substrate 1. Incidentally, the ion implantation here is conducted by using a resist pattern as a mask, so as to introduce an n-type impurity into a region for forming an n-type MOS transistor and to introduce a p-type impurity into a region for forming a p-type MOS transistor. For example, arsenic as an n-type impurity is introduced into the region for forming the n-type MOS transistor by ion implantation at an implantation energy of 1 keV and in a dose of 1E14 atoms/cm², and the activating heat treatment for the impurity is carried out by a rapid heat treatment (Rapid Thermal Anneal: RTA) at 950° C. for 5 sec.

Figure 2C:
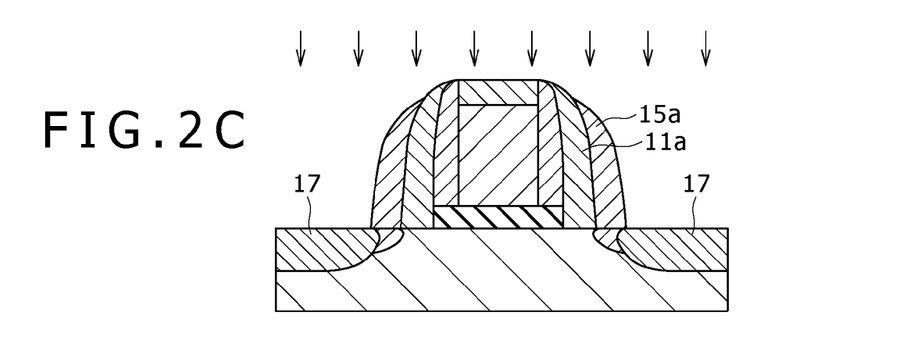

Next, as shown in FIG. 2C, third side walls 15a including silicon oxide are formed on the outside of the second side walls 9a. Thereafter, an impurity is introduced into an exposed surface layer of the semiconductor substrate 1 by ion implantation conducted by using the third side walls 15a and the like as a mask. Subsequently, an activating heat treatment for the impurity thus introduced is conducted, to form source/drain regions 17 in the surface layer of the semiconductor substrate 1. Incidentally, the ion implantation here is conducted by use of a resist pattern as a mask so as to introduce an n-type impurity into a region for forming an n-type MOS transistor and to introduce a p-type impurity into a region for forming a p-type MOS transistor. For example, arsenic as an n-type impurity is introduced into the region for forming the n-type MOS transistor by ion implantation at an implantation energy of 20 keV and in a dose of 1E15 atoms/cm², and the activating heat treatment for the impurity is carried out by RTA at 1000° C. for 10 sec.

Figure 2D:
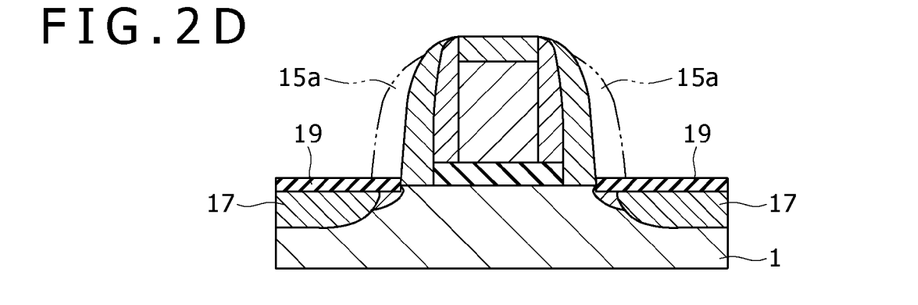

Next, as shown in FIG. 2D, the third side walls 15a including silicon oxide are removed by washing with a chemical liquid including hydrofluoric acid. Subsequently, a silicide layer 19 is formed at an exposed surface layer of the semiconductor substrate 1, i.e., the surface layers of the source/drain regions 17 and the low-dose diffusion layer 13. In this case, for example, a metal film of nickel (Ni) or the like is formed in a thickness of about 10 nm by PVD, and then a high temperature treatment such as RTA is conducted to silicide the surface layer of the semiconductor substrate 1. After the siliciding is over, the metal film left upon the siliciding is removed.

Figure 3A:
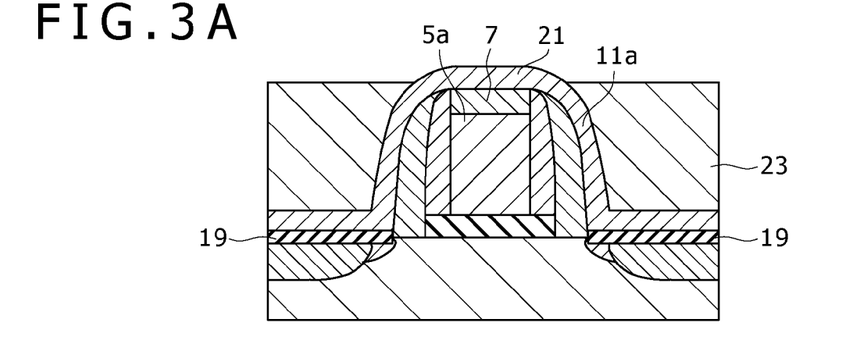
FIGS. 3A to 3D are sectional step diagrams (No. 3) illustrating the method of manufacturing a semiconductor device according to the first embodiment.

Subsequently, as shown in FIG. 3A, a stopper film 21 including silicon nitride is built up in a thickness of about 30 nm in the state of covering the gate electrode 5a, the second side walls 11a and the silicide layers 19 by CVD. Next, an interlayer insulating film 23 including silicon oxide is built up by CVD in such a thickness (e.g., 500 nm) as to bury the gate electrode 5a. Thereafter, the layer insulation film 23 is subjected to CMP, to expose the stopper film 21 and to flatten the interlayer insulating film 23.

Figure 3B:
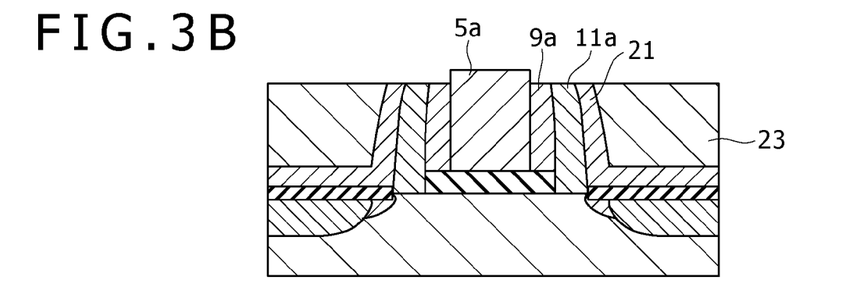

Subsequently, as shown in FIG. 3B, RIE of the stopper film 21 and the stopper layer 7 which include silicon nitride, as contrasted to the interlayer insulating film 23 including silicon oxide, is conducted to expose a surface of the gate electrode 5a. As a result, upper parts of the side walls 9a, 11a including silicon nitride are also removed, so that side walls of an upper part of the gate electrode 5a are also exposed.

Figure 3C:
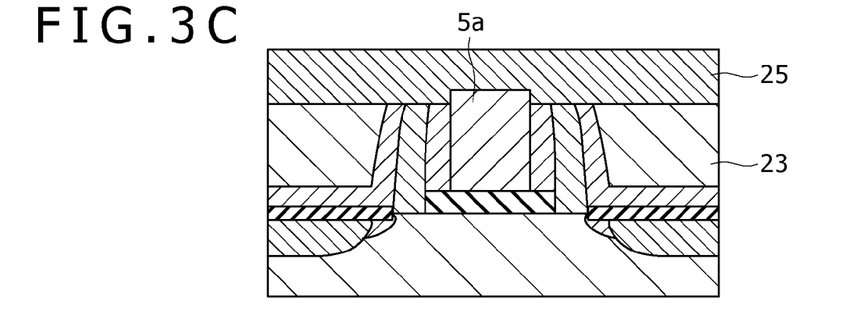

Then, as shown in FIG. 3C, a metal film 25 of nickel (Ni) or the like is formed in a thickness of about 10 nm in the state of making contact with the gate electrode 5a by PVD.

Figure 3D:
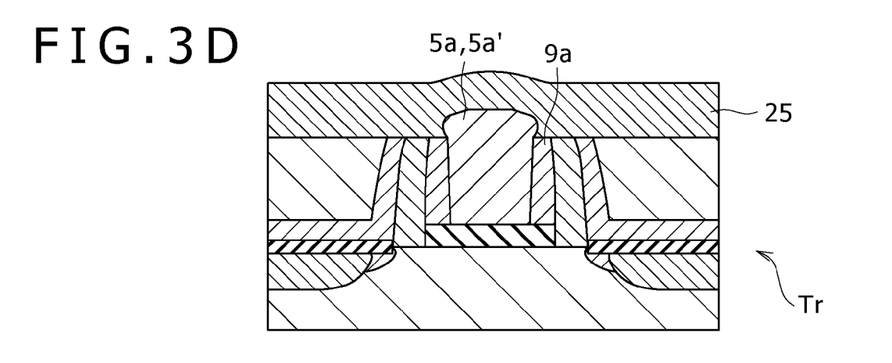

Thereafter, as shown in FIG. 3D, a heat treatment such as RTA is conducted, to silicide the gate electrode 5a which has been formed by patterning a polysilicon film. Here, it is important to fully (wholly) silicide the gate electrode 5a, thereby forming the fully silicided gate electrode 5a'. Consequently, a n-type and a p-type MOS transistor Tr having the fully silicided gate electrode 5a' are obtained.

Figure 4A:
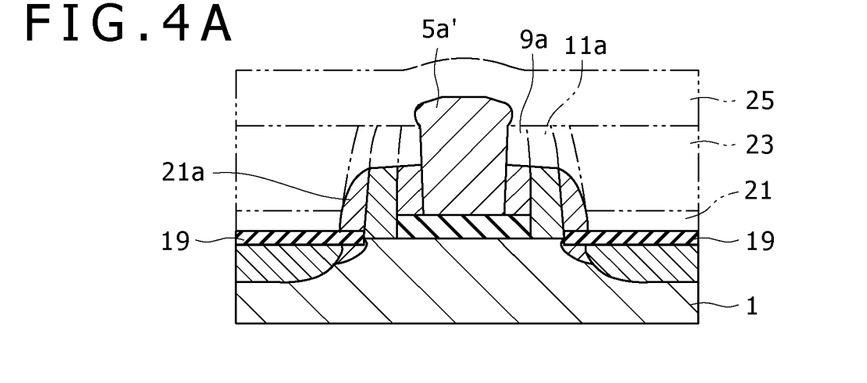
FIGS. 4A to 4C are sectional step diagrams (No. 4) illustrating the method of manufacturing a semiconductor device according to the first embodiment.

After the above steps, as shown in FIG. 4A, the metal film 25 left upon the siliciding is etched away, then the interlayer insulating film 23 including silicon oxide is etched away, and, further, the stopper film 21 including silicon nitride is removed, to expose the silicide layer 19 at the surface of the semiconductor substrate 1. In this case, the side walls 9a, 11a including silicon nitride are also reduced in film amount by the etching, and side walls 21a including silicon nitride are left at the lower side of side walls of the fully silicided gate electrode 5a'.

Figure 4B:
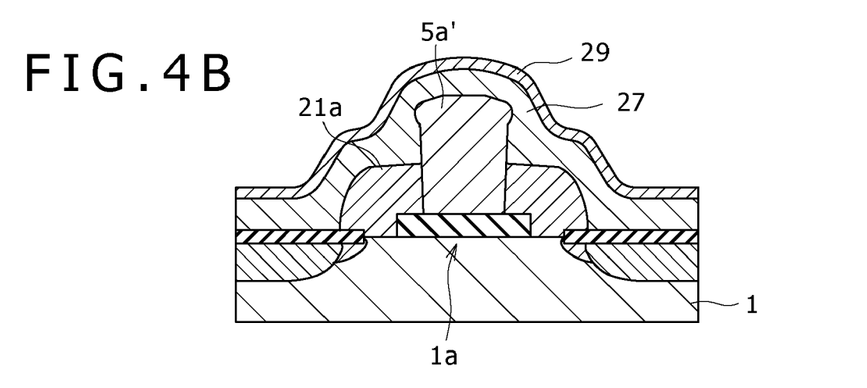

Thereafter, as shown in FIG. 4B, a stress film 27 including silicon nitride and a stopper film 29 are formed in the state of covering the fully silicided gate electrode 5a' and the side walls 21a. The stress film 27 is a film for exerting a stress on a channel region 1a under the fully silicided gate electrode 5a'. In this case, a dual stress liner (DSL) film is formed so that a tensile stress is exerted on the region where the n-type MOS transistor Tr is formed and that a compressive stress is exerted on the region where the p-type MOS transistor Tr is formed.

In this case, first, a silicon nitride film having a tensile stress (Tensile $Si_3N_4$) as the stress film 27 is formed in a thickness of about 30 nm by CVD or the like. Next, as the stopper film 29 at the time of processing the stress film 27, a silicon oxide film is built up in a thickness of about 10 nm by CVD or the like. Then, etching is conducted using a resist pattern as a mask, to remove the stopper film 29 and the stress film 27 in the region where the p-type MOS transistor Tr is formed.

By the above-mentioned steps, the region where the n-type MOS transistor Tr is formed is covered with the stress film 27 for exerting a tensile stress on the channel region 1a.

Next, a silicon nitride film having a compressive stress (Compressive $Si_3N_4$) as the stress film 27 is built up in a thickness of about 30 nm by CVD or the like. Then, as the stopper film 29 at the time of processing the stress film 27, a silicon oxide film is built up in a thickness of about 10 nm by CVD or the like. Thereafter, etching is conducted by use of a resist pattern as a mask, to remove the stopper film 29 and the stress film 27 in the region where the n-type MOS transistor Tr is formed.

By the above-mentioned steps, the region where the p-type MOS transistor Tr is formed is covered with the stress film 27 for exerting a compressive stress on the channel region 1a.

Figure 4C:
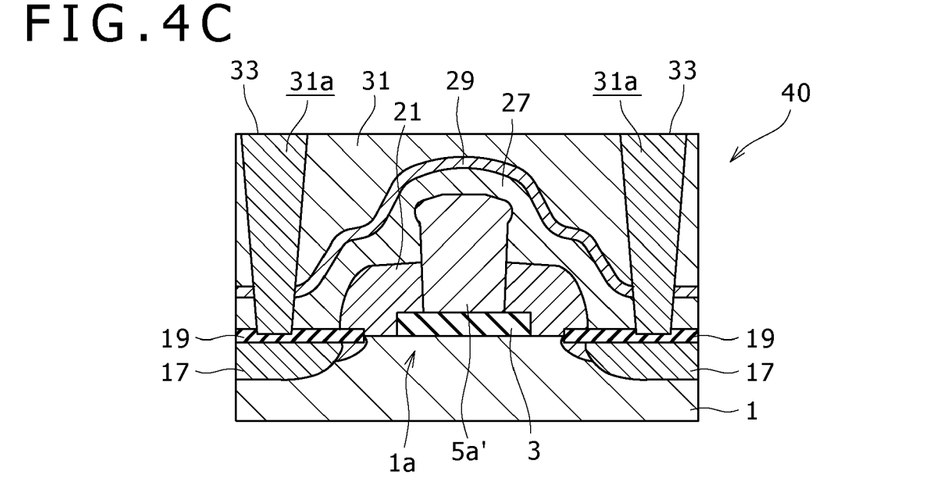

Thereafter, as shown in FIG. 4C, an interlayer insulating film 31 including silicon oxide is formed over the stopper film 29, then flattening by CMP is conducted if required, and connection holes 31a reaching the silicide layer 19 are formed in the interlayer insulating film 31, the stopper film 29 and the stress film 27. Then, wiring conductors 33 connected to the source/drain regions 17 through the connection hole 31 and the silicide layer 19 are formed, to complete a semiconductor device 40.

The semiconductor device 40 thus completed has the gate insulating film 3, which is broader than the fully silicided gate electrode 5a', between the fully silicided gate electrode 5a' and the semiconductor substrate 1.

In the first embodiment as above, as has been described using FIG. 3D, full siliciding of the gate electrode 5a formed by patterning a polysilicon film is conducted in the condition where the continuous gate insulating film 33 is present beneath the gate electrode 5a and the first side walls 9a at both sides thereof, i.e., in the absence of an interface that rectilinearly connects the gate electrode 5a and the semiconductor substrate 1 to each other. Therefore, even in the case where a gap is generated due to delamination at an interface disposed in the range from the gate electrode 5a to the semiconductor substrate 1 as a result of expansion attendant on full siliciding of the gate electrode 5a, it is possible to prevent a silicide material constituting the gate electrode 5a, particularly the metal, from migrating by diffusion to the semiconductor substrate 1 side.

As a result, the metallic material contained in the fully silicided gate electrode 5a' can be prevented from migrating by diffusion to the semiconductor substrate 1 side, so that it is possible to obtain a semiconductor device 10 in which variations in threshold voltage, leakage and the like troubles are prevented, notwithstanding the presence of the fully silicided gate electrode 5a', and in which the device characteristics are maintained stably.

In addition, as above-mentioned, the metallic material contained in the fully silicided gate electrode 5a (can be prevented from diffusing to the semiconductor substrate 1 side, so that there is no need for thinning of the fully silicided gate electrode 5a' in order to suppress volume expansion of the fully silicided gate electrode 5a' in the full siliciding step. This makes it possible to maintain the height of the fully silicided gate electrode 5a', and to augment the stress exerted on the channel region 1a from the stress film 27 covering the fully silicided gate electrode 5a'. Therefore, it becomes possible to obtain a semiconductor device 40 in which an increased stress can be exerted on the channel region 1a from the stress film 27, thereby securing an enhanced carrier mobility, and which is capable of high-speed operations.

Furthermore, since the height of the fully silicided gate electrode 5a' can be maintained, the width of the side walls 21a can be kept large. This ensures that the side periphery of the fully silicided gate electrode 5a' is sufficiently protected by the side walls 21a. Therefore, the side walls 21a serve as a stopper in forming the connection holes 31a, and short-circuiting between the connection hole 31a and the semiconductor substrate 1 can be restrained.

Second Embodiment

First, the same procedure as described using FIGS. 1A to 1D in the first embodiment above is carried out, whereby a gate insulating film 3 is patterned over a semiconductor substrate 1, a gate electrode 5a having a width W1 smaller than the width W0 of the gate insulating film 3 is provided over a central part of the gate insulating film 3, and first side walls 9a are provided at both side walls of the gate electrode 5a. In other words, a structure is formed in which the gate insulating film 3 under the gate electrode 5a is protruding into the areas under the first side walls 9a.

Figure 5A:
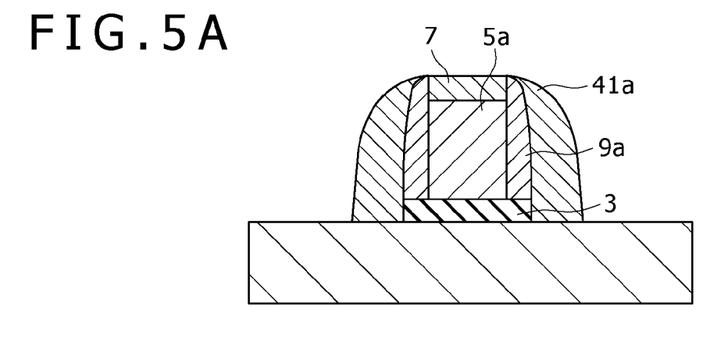
FIGS. 5A to 5D are sectional step diagrams (No. 1) illustrating a method of manufacturing a semiconductor device according to a second embodiment of the present invention.

Thereafter, as shown in FIG. 5A, disposable side walls 41a including silicon oxide are formed on the outside of the first side walls 9a. The disposable side walls 41a are formed by first building up a silicon oxide film in a thickness of about 20-100 nm and then subjecting the silicon oxide film to RIE. As a result, side walls of the gate insulating film 3 including a high dielectric constant material are covered with the disposable side walls 41a. Therefore, even when oxidation or a heat treatment or building-up of an insulating film in a oxidizing gas-containing atmosphere is carried out in the subsequent step(s), it is possible to prevent contamination of the semiconductor substrate 1 with a metal from the interface of the gate insulating film 3 or a lowering in relative permittivity of the gate insulating film 3 due to formation of a very thin silicon oxide film onto the interface of the semiconductor substrate 1.

Figure 5B:
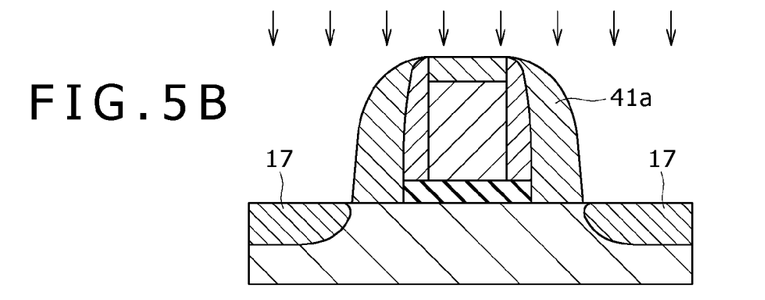

Next, as shown in FIG. 5B, an impurity is introduced into an exposed surface layer of the semiconductor substrate 1 by ion implantation conducted by use of the disposable side walls 41a and the like as a mask. Then, an activating heat treatment for the thus introduced impurity is conducted, to form source/drain regions 17 in a surface layer of the semiconductor substrate 1. Incidentally, the ion implantation here is conducted by using a resist pattern as a mask, to introduce an n-type impurity into a region for forming an n-type MOS transistor and to introduce a p-type impurity into a region for forming a p-type MOS transistor. For example, arsenic as an n-type impurity is introduced into the region for forming the n-type MOS transistor by ion implantation at an implantation energy of 20 keV and in a dose of 1E15 atoms/cm$^2$, and the activating heat treatment for the impurity is conducted by RTA at 1000° C. for 10 sec.

Figure 5C:
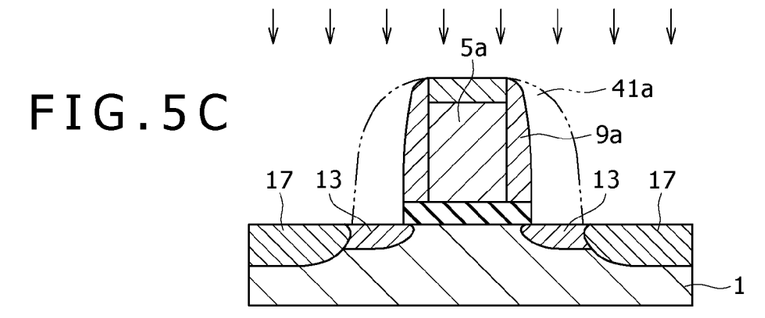

Subsequently, as shown in FIG. 5C, the disposable side walls 41a are removed by isotropic etching. Thereafter, an impurity is introduced into the exposed surface layer of the semiconductor substrate 1 by ion implantation conducted by using the gate electrode 5a and the first side walls 9a as a mask. Next, an activating heat treatment for the thus introduced impurity is conducted, to form a low-dose diffusion layer (LDD) 13 at the surface layer of the semiconductor substrate 1. Incidentally, the ion implantation here is conducted by using a resist pattern as a mask, to introduce an n-type impurity into a region for forming an n-type MOS transistor and to introduce a p-type impurity into a region for forming a p-type MOS transistor. For example, arsenic as an n-type impurity is introduced into the region for forming the n-type MOS transistor by ion implantation at an implantation energy of 1 keV and in a dose of 1E14 atoms/cm$^2$, and the activating heat treatment for the impurity is conducted by RTA at 950° C. for 5 sec.

Thereafter, the same procedure as described using FIG. 2D and the latter figures in the first embodiment above is conducted.

Figure 5D:
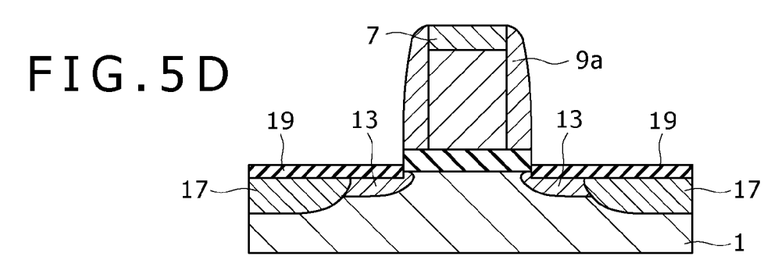

Specifically, first, as shown in FIG. 5D, a silicide layer 19 is formed at an exposed surface layer of the semiconductor substrate 1.

Figure 6A:
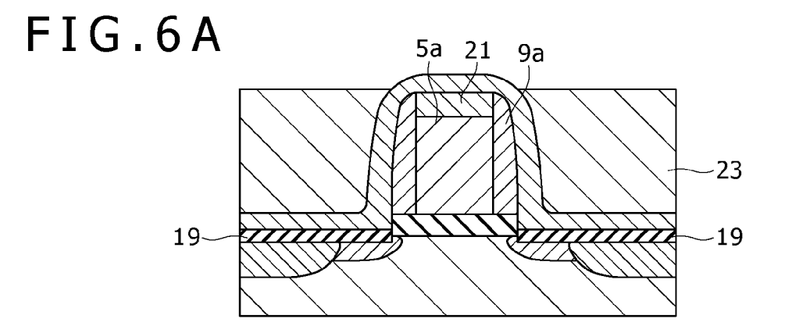
FIGS. 6A to 6D are sectional step diagrams (No. 2) illustrating the method of manufacturing a semiconductor device according to the second embodiment.

Next, as shown in FIG. 6A, a stopper film 21 including silicon nitride is built up so as to cover the gate electrode 5a, the first side walls 9a and the silicide layers 19. Further, an interlayer insulating film 23 including silicon oxide is built up, followed by CMP, to expose the stopper film 21 and flatten the interlayer insulating film 23.

Figure 6B:
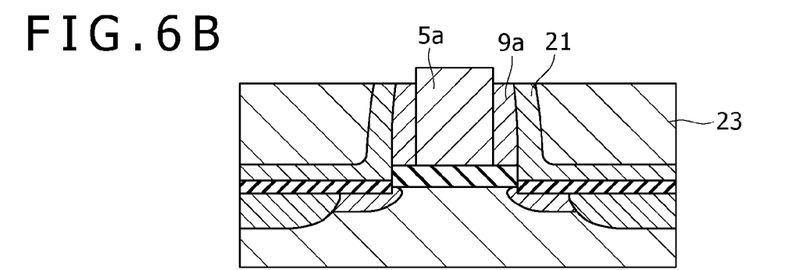
Figure 6C:
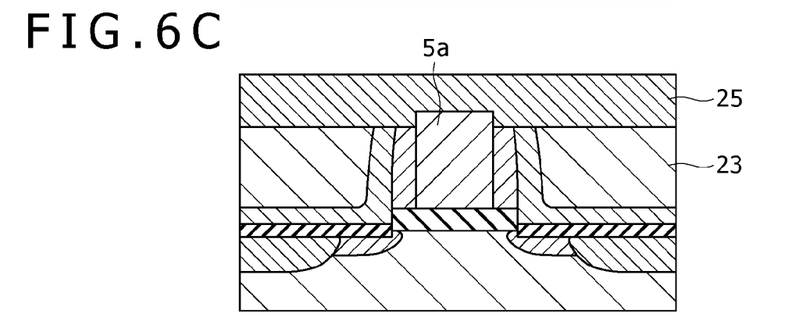

Subsequently, as shown in FIG. 6B, RIE of the stopper film 21 and the side walls 9a, 11a which include silicon nitride is conducted to expose a surface of the gate electrode 5a. Then, as shown in FIG. 6C, a metal film 25 of nickel (Ni) or the like is formed in contact with the gate electrode 5a.

Figure 6D:
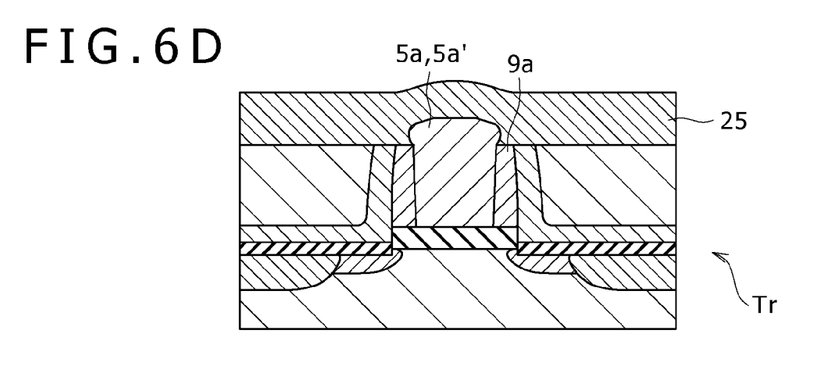

Thereafter, as shown in FIG. 6D, the gate electrode 5a formed by patterning a polysilicon film is fully silicided by a heat treatment such as RTA, to obtain an n-type and a p-type MOS transistor Tr having the fully silicided gate electrode 5a'.

Figure 7A:
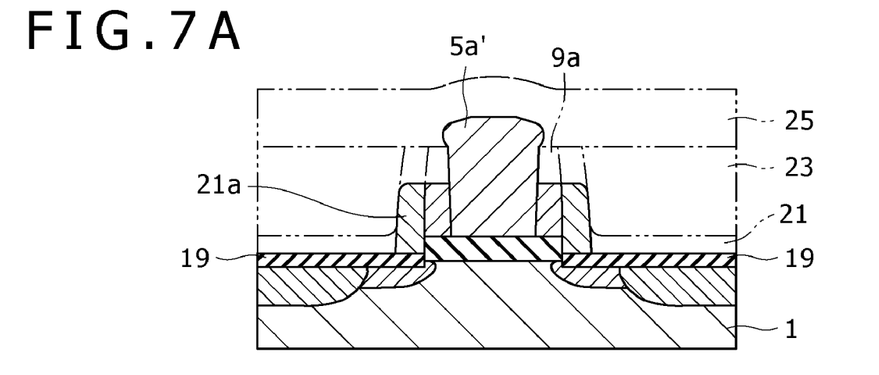
FIGS. 7A to 7C are sectional step diagrams (No. 3) illustrating the method of manufacturing a semiconductor device according to the second embodiment.

Next, as shown in FIG. 7A, the metal film 25 and the interlayer insulating film 23 are etched away, and, further, the stopper film 21 including silicon nitride is removed, to expose the silicide layer 19 at the surface of the semiconductor substrate 1. In this case, the side walls 9a including silicon nitride are also reduced in film amount, so that the side walls 21a including silicon nitride are left at the lower side of side walls of the fully silicided gate electrode 5a'.

Figure 7B:
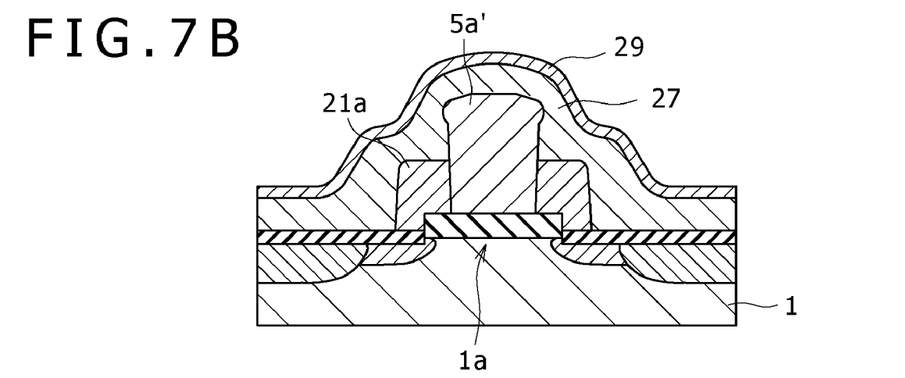

Thereafter, as shown in FIG. 7B, a stress film 27 (dual stress liner film) is formed over the semiconductor substrate 1 so as to cover the fully silicided gate electrode 5a' and the side walls 21a, and, further, a stopper film 29 including silicon oxide is formed.

Figure 7C:
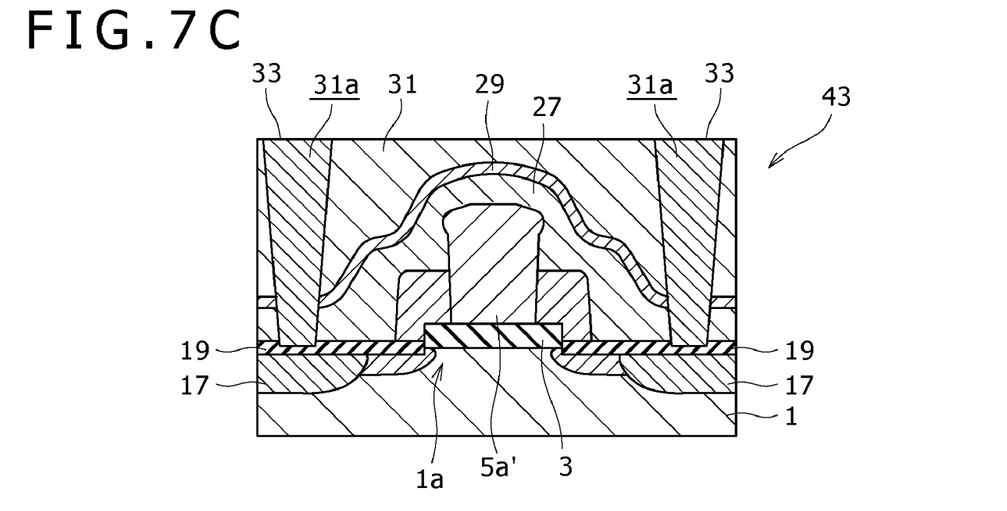

After the above steps, as shown in FIG. 7C, an interlayer insulating film 31 including silicon oxide is formed over the stopper film 29, flattening by CMP is conducted if required, and then connection holes 31a reaching the silicide layer 19 are formed in the interlayer insulating film 31, the stopper film 29 and the stress film 27. Then, wiring conductors 33 connected to the source/drain regions 17 through the connection hole 31 and the silicide layer 19 are formed, to complete a semiconductor device 43.

The semiconductor device 43 thus completed has the gate insulating film 3, which is broader than the fully silicided gate electrode 5a', between the fully silicided gate electrode 5a' and the semiconductor substrate 1.

Also in the above-described second embodiment, as has been described using FIG. 6D above, the full siliciding of the gate electrode 5a is conducted in the condition where the continuous gate insulating film 3 is present beneath the gate electrode 5a formed by patterning a polysilicon film and the first side walls 9a at both sides of the gate electrode 5a, i.e., in the absence of an interface that rectilinearly connects the gate electrode 5a and the semiconductor substrate 1 to each other. Therefore, the same effects as in the first embodiment can be obtained.

Besides, in the second embodiment, as has been described using FIGS. 5B and 5C, the low-dose diffusion layer 13 is formed after the formation of the source/drain regions 17 needing a heat treatment at a higher temperature for activation of an impurity, by use of the disposable side walls 41a. This ensures that the low-dose diffusion layer 13 is not affected by the heat treatment for forming the source/drain regions 17, so that the low-dose diffusion layer 13 can be formed with high accuracy.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   a gate insulating film over a semiconductor substrate;
   a gate electrode over said gate insulating film;
   side walls surrounding said gate electrode;
   a stopper film surrounding said side walls such that the stopper film is not on said gate insulating film;
   wherein
   said gate insulating film protrudes from both sides of said gate electrode;
   said gate electrode protrudes above said side walls and said stopper film such that upper side walls of said gate electrode are exposed relative to said sidewalls and said stopper film; and
   said gate electrode includes a fully silicided layer.

2. The semiconductor device as set forth in claim 1, wherein said gate insulating film has a high dielectric constant material film containing a metal oxide.

3. The semiconductor device of claim 1, wherein a width (W0) of said gate insulating film is equal to a sum of a width (W1) of the gate electrode and widths of the sidewalls that are provided on both sides of the gate electrode.

4. The semiconductor device of claim 1, further comprising:
   a source/drain region for the semiconductor device, wherein the source/drain region is spaced from said gate insulating film such that the source/drain region is not in contact with said gate insulating film.

5. A semiconductor device comprising:
   a gate insulating film over a semiconductor substrate;
   a gate electrode over said gate insulating film;
   side walls surrounding said gate electrode;
   a stopper film surrounding said side walls such that the stopper film is not on said gate insulating film; and
   a stress layer for exerting a stress on a channel region under said gate electrode is provided in the state of covering said gate electrode,
   wherein,
   said gate insulating film protrudes from both sides of said gate electrode; and
   said gate electrode includes a fully silicided layer.

* * * * *